United States Patent [19]
Ida et al.

[11] Patent Number: 6,030,266
[45] Date of Patent: Feb. 29, 2000

[54] PROCESS AND APPARATUS FOR THE FORMATION OF PATTERNS IN A PHOTORESIST BY CONTINUOUS LASER IRRADIATION, APPLICATION TO THE PRODUCTION OF MICROTIPS EMISSIVE CATHODE ELECTRON SOURCES AND FLAT DISPLAY SCREENS

[75] Inventors: Michel Ida, Voreppe; Marc Rabarot, Seyssinet, both of France

[73] Assignee: Commissariat a l'Energie Atomique, Paris, France

[21] Appl. No.: 08/899,169

[22] Filed: Jul. 23, 1997

[30] Foreign Application Priority Data

Jul. 29, 1996 [FR] France ................................. 9609520

[51] Int. Cl.$^7$ ........................................................ H01J 9/00
[52] U.S. Cl. ........................................................... 445/24
[58] Field of Search ...................... 495/24, 50; 430/396; 205/667

[56] References Cited

U.S. PATENT DOCUMENTS

| | | |
|---|---|---|
| 4,857,161 | 8/1989 | Borel et al. . |
| 5,194,780 | 3/1993 | Meyer . |
| 5,415,835 | 5/1995 | Brueck et al. . |
| 5,534,744 | 7/1996 | Leroux et al. . |
| 5,669,800 | 9/1997 | Ida et al. . |
| 5,759,744 | 6/1998 | Brueck et al. ........................ 430/312 |

FOREIGN PATENT DOCUMENTS

| | | |
|---|---|---|
| 0 709 741 | 5/1996 | European Pat. Off. . |
| 2 593 953 | 1/1986 | France . |
| 2 663 462 | 6/1990 | France . |
| 2 687 839 | 8/1996 | France . |
| WO 96/26468 | 8/1996 | WIPO . |

OTHER PUBLICATIONS

J.P. Spallas, et al., IVMC Conference, 1995, "Large Scale Field Emitter Array Patterning For Flat Panel Displays Using Laser Interference Lithography".

Carol O. Bozler, et al., Journal of Vacuum Science & Technology, vol. 12, No. 2, pp. 629–632, Mar./Apr. 1994, "Arrays of Gated Field–Emitter Cones Having o.32 UM Tip–To–Tip Spacing".

J.M. Carter, et al., Journal of Vacuum Science & Technology, vol. 10, No. 6, pp. 2909–2911, Nov./Dec. 1992, "Large–Area, Free–Standing Gratings For Atom Interferometry Produced Using Holographic Lithography".

Michel De Labachelerie, Japon Optoelectronique, No. 17, pp. 16&17, Dec. 1993–Feb. 1994, "Lighographie Tridimensionnelle Par Exposition A Niveaux De Gris".

Masamitsu Haruna, et al., Applied Optics, vol. 29, No. 34, pp. 5120–5126, Dec. 1, 1990, "Laser Beam Lithographed Micro–Fresnel Lenses".

Theresa R. Jay, et al., Miniature and Micro–Optics and Micromechanics, SPIE vol. 1992, pp. 275–282, 1993, "Preshaping Photoresist For Refractive Microlens Fabrication".

(List continued on next page.)

*Primary Examiner*—Nimeshkumar D. Patel
*Assistant Examiner*—Michael J. Smith
*Attorney, Agent, or Firm*—Oblon, Spivak, McClelland, Maier & Neustadt, P.C.

[57] ABSTRACT

Process and apparatus for the formation of patterns in a photosensitive resin layer or photoresist by continuous laser irradiation, application to the production of microtip emissive cathode electron sources and flat display screens. Formation takes place of non-mutually interfering elementary light beams (41), there is at least one relative translation at constant light power and speed of said beams with respect to the layer in order to irradiate lines thereof, each line receiving a light dose lower than that necessary for the development of the resin, a relative rotation of all the beams with respect to the layer takes place, the translation is recommenced in order to irradiate other lines, each line receiving a light dose complimentary to the preceding dose and the resin is developed.

14 Claims, 3 Drawing Sheets

OTHER PUBLICATIONS

Y. Oppliger, et al., Microelectronic Engineering, vol. 23, pp. 449–454, 1994 "One–Step 3D Shaping Using a Gray–Tone Mask for Optical and Microelectronic Applications".

Georges Przyrembel, pp. 219–228, "Continuous–Relief Microoptical Elements Fabricated by Laser Beam Writing".

H.J. Quenzer, et al., pp. 163–172, "Fabrication of Relief–Topographic Surfaces with a One–Step Uv–Litographic Porcess".

T.A. Savas, et al., Journal of Vacuum Science & Technology B., vol. 13, No. 6, pp. 2732–2735, Nov./Dec. 1995, "Achromatic Interferometric Lithography for 100–NM–Period Gratings and Grids".

Joerg Wengelink, et al., pp. 209–217, "Generation of Relief–Type Surface Topographies for Integrated Microoptical Elements".

J. P. Spallas, et al., Journal of Vacuum Science & Technology B, vol. 13, No. 5, pp. 1973–1978, Sep./Oct. 1995, "Field Emitter Array Mask Patterning Using Laser Interference Lithography".

PROCESS AND APPARATUS FOR THE FORMATION OF PATTERNS IN A PHOTORESIST BY CONTINUOUS LASER IRRADIATION, APPLICATION TO THE PRODUCTION OF MICROTIPS EMISSIVE CATHODE ELECTRON SOURCES AND FLAT DISPLAY SCREENS

BACKGROUND

1. Technical Field

The present invention relates to a process for the formation of patterns (e.g. holes), in a photosensitive resin layer or photoresist, as well as to an apparatus for performing this process. The invention more particularly applies to the production of microtip emissive cathode electron sources, which are more particularly used in the fabrication of display means by cathodoluminescence excited by field emission. The invention makes it possible to produce microtip flat screens of a larger size than that of the prior art (e.g. exceeding 14 inches and even microtip flat screens with an area close to 1 $m^2$).

2. Prior Art

Microtip emissive cathode electron sources and their production processes are described in (1) FR-A-2 593 953 (cf. also EP-A-234 989); (2) U.S. Pat. No. 4,857,161 (corresponding to document (1); (3) FR-A-2 663 462 (cf. also EP-A-461 990 and U.S. Pat. No. 5,194,780); (4) FR-A-2 687 839 (cf. also EP-A-558 393 and U.S. patent application Ser. No. 08/022,935 by Leroux et al. of 26.2.1993) to which reference can be made. To facilitate understanding of the technical problem solved by the present invention, a description will now be given of a known example of a process for the production of a microtip emissive cathode electron source, with reference to the attached FIGS. 1.

FIG. 1 shows an existing structure comprising a substrate 2, surmounted by an insulator 4, a system constituted by cathode conductors 6, a resistive layer 7 and grids 8, the conductors 6 and grids 8 being superimposed in crossed form with an intermediate insulator 10 and a mask 12 (e.g. nickel layer) deposited on the surface to serve as a mask during the microtip production operations. This nickel layer 12, the grids 8 and the insulator 10 are perforated by holes 14, on the bottom of which will be subsequently deposited the microtips made from a conductor metal electrically connected to cathode conductors 6 through the resistive layer 7.

The production of the microtips will now be explained relative to FIG. 2. Firstly in exemplified manner a molybdenum layer 16 is deposited on the complete structure. The layer 16 has a thickness of approximately 1.8 $\mu$m. It is deposited under normal incidence with respect to the surface of the structure. This deposition procedure makes it possible to obtain molybdenum cones 18 located in holes 14 and having a height of 1.2 to 1.5 $\mu$m. These cones form the electron emitting microtips. This is followed by the selective dissolving of the nickel layer 12 using an electrochemical process so as to free, as can be seen in FIG. 3, the perforated grids 8, which are e.g. of niobium, and bring about the appearance of the electron emitting microtips 18.

To within a few technological variants, the thus described known process with reference to FIGS. 1, 2 and 3 is one of those used for producing microtips of microtip emissive cathode electron sources. In order that the size and positioning of the microtips 18 are correct, it is obviously necessary to perfectly control the size of the holes made in the grids 8 and in the insulator 10. It is a question of producing on all the surfaces which are to receive microtips, holes with a mean diameter of e.g. 1.3 $\mu$m or less. The methods used at present for producing these holes use photolithography processes employing the direct projection or photorepetition of an elementary pattern reproduced on all these surfaces.

In the case of large electron sources, larger than 14 inches (approximately 35 cm), the process of producing this pattern of holes rapidly become constrictive. The direct projection requires the production of a large scale size mask having submicron patterns. These patterns are generally formed from thin film metal deposited on a glass or silica substrate. It is difficult to produce this mask in excess of 14 inches diagonal using conventional microelectronics methods.

With regards to photorepetition, use is made of a small mask, the size being determined by the resolution of the patterns used. For a resolution of 1 $\mu$m, use is made, for e.g., of a 20 to 50 mm side length mask, which makes it necessary to repeat a large number of times the irradiation operation necessary for photolithography in order to cover the complete surface of the electron source.

These two methods (one using direct projection and the other photorepetition) are consequently difficult to apply to the production of large electron sources.

Another method referred to in (1) "Large scale field emitter array patterning for flat panel displays using laser interference lithography", J. P. SPALLAS, R. D. BOYD, J. A. BRITTEN, IVMC Conference 1995; (2) "Arrays of gated filed emitter cones having 0.32 $\mu$m tip to tip spacing", C. O. BOLZER, C. T. HARRIS, S. RABE, D. RATHMAN, J. Vac. Sci. Technol. B12(2), March/April 1994, p 629; (3) "Achromatic interferometric lithography for 100 nm period gratings and grids", T. A. SAVAS, S. N. SHAH, H. I. SMITH, J. Vac. Sci. Technol. B13(6), November/December 1995, p 2732; (4) "Large area, flee-standing gratings for atom interferometry produced using holographic lithography", J. M. CARTER, D. B. OLSTER, M. L. SCHATTENBURG, A. YEN, H. I. SMITH, J. Vac. Sci. Technol. B10(6), November/December 1992, p 2909 consists of carrying out photolithography with the aid of laser interferences in order to irradiate a photosensitive resin. This method consists of creating a system of light fringes on the surface of the resin by bringing about interference between two laser beams forming a given angle and coming from the same laser, followed by the recommencement of said operation after turning the substrate by 90°. This gives an irradiated area in grid form, whose intersections are twice more irradiated than the remainder. After development of the resin and in the case where a positive resin is used, there is consequently an array of holes, whose period (distance between two holes) is equal to the distance between two light fringes.

Among recent publications referring to this process, reference can be made to that of J. P. SPALLAS et al., Lawrence Livermore National Laboratory (IVMC95), which mentions the production of an array of $10^{11}$ tips, of diameter 330 nm, on a 50 $cm^2$ substrate (cf. document (5)). However, the authors of this publication remain very discreet concerning the results obtained. Thus, the AFM (atomic force microscope) photographs published are in all cases relative to small substrates of a few $cm^2$. Reference can e.g. made to an array of photosensitive resin tips of diameter 330 nm, spaced by 670 nm and having a height of 250 nm on a 2.5×7.5 cm substrate.

With regards to their tests on a 50 $cm^2$ plate, the experimental conditions are as follows:

krypton laser emitting a radiation of wavelength 413 nm, resin marketed by Shipley under reference 1400, whose refractive index is close to that of the glass substrate in order to avoid interference, spreading of the resin in a system known as meniscus coating, total irradiation time of 4 minutes (2 minutes for each half irradiation).

Thus, no information is given on the uniformity defects, which would probably appear as a result of imperfections of the profile of the laser beams. No information is given on the collimation of the laser beams. Moreover, this method significantly restricts the choice of the configuration and distribution of the holes. Thus, the period P of the array, i.e. the distance between two successive holes, is directly linked with the wavelength $\lambda$ of the laser used and the angle $\theta$ between the two beams from said laser, which are made to interfere in order to create the system of light fringes, so that it is possible to write: $P=\lambda/(2 \sin \theta)$. Thus, for a given laser wavelength $\lambda$ and given angle $\theta$, it would only be possible to obtain an array of holes with a fixed spacing. The size of the holes is determined by the width of the interference fringes.

The present invention avoids all the aforementioned problems. It makes it possible to produce a mask for the formation of holes corresponding to electron emitters in a much simpler manner than the aforementioned prior art methods. It relates to a very simple process for the formation of holes or other patterns in a photoresist, as well as to an apparatus for performing this process. The invention makes it possible to form holes with a diameter of or below 1 $\mu$m over small or large surfaces. The invention makes it possible to irradiate a photoresist with the aid of a laser beam without light interferences.

Once this photosensitive resin has been developed (i.e. after dissolving the irradiated areas), it can be used as a mask for forming patterns, such as e.g. holes for microtip electron sources, in a structure on which the photoresist is located.

For example, considering the structure described with reference to FIGS. 1 to 3, the photoresist can serve, after development, for the etching of the grids 8 and the intermediate insulator 10.

One aim of the present invention is to propose a process and an apparatus for producing micrometric or submicrometric patterns in intaglio or relief in a photoresist.

The present invention also aims at a process for the formation of patterns in an intaglio, e.g. holes, or in relief, by the laser photolithography of a photoresist and the etching of one or a plurality of layers placed beneath said photosensitive resin.

Another aim of the invention is to propose a process which is simple to perform and which makes it possible to treat substrates having a photoresist with a large area of e.g. 1 $m^2$.

The authors of the present invention have attempted to evaluate the possibilities of photolithography of holes by direct laser recording in the existing state of the art with respect to lasers, (without light interferences). The technical problems which arise are described hereinafter.

The staring hypothesis is still the same, the aim being to e.g. produce $10^4$ holes per $mm^2$ on a substrate of approximately 1 $m^2$. Therefore the initial parameters are as follows:

$10^{10}$ holes to be produced, diameter of holes 1 $\mu$m, surface of one hole 0.785 $\mu m^2$, photosensitivity of the photosensitive resin S=300 $mJ/cm^2$ (standard value).

From this is deduced the light dose D necessary for the irradiation of a hole, i.e. D=2.4 nW/s.

We will now consider the limitations of existing laser systems, namely laser diodes, microlasers, gas lasers and YAG solid lasers.

Laser diodes operate at frequencies of approximately 1 MHz. They supply a peak power of a few watts, which could satisfy the application considered here, but it is presently impossible in the state of the art to focus the laser beam onto such small surfaces.

With regards to microlasers, the presently usable operating frequencies are approximately 10 KHz and there is no microlaser able to emit in the ultraviolet range. Thus, microlasers are unusable for the application considered here.

With regards to gas lasers in the ultraviolet field, existing excimer lasers operate at a few $W/cm^2$ in the continuous or burst mode, but in the pulsed mode the maximum frequencies are a few dozen hertz. Thus, these gas layers do not satisfy the application considered here.

In the case of YAG solid lasers, by tripling the frequency thereof, it is possible to operate at approximately 355 nm. In the continuous mode a few watts are obtained without difficulty. However, such solid lasers are unusable for the application considered here in the pulsed mode, because the maximum frequency is approximately 10 kHz.

Consideration could be given to recording by sequential irradiation hole by hole. In this case the aim is to irradiate the holes and nothing else.

One solution e.g. consists of using a YAG laser and overcoming the frequency problem by subdividing the light beam produced into multiple elementary beams (e.g. 1000). For this purpose use is made of a bundle of optical fibres or an image multiplier system coupled to a microlens strip or linear array in order to refocus the elementary beams at the exit. These microlenses exist in integrated strip form and it is possible to arrange a microlens approximately every 100 $\mu$m, which leads to a 10 cm long apparatus. The problem which then has to be solved is the coordination of the displacement and alignment of the system obtained with the modulation of the laser beam.

A mechanical displacement in two perpendicular directions x and y is inconceivable due to the speed necessary. Information might be obtainable from rotary mirror systems used in photocopiers for deflecting the elementary beams of a pulsed YAG laser and avoid the displacement on each occasion of the strip. With such a system, it would be necessary to photorepeat a sequence of laser flashes with stoppage of the laser and alignment between each sequence.

Another solution would consist of working with a YAG laser in the continuous mode and displacing the elementary beams sufficiently rapidly between the holes so as not to irradiate the resin. This solution avoids the synchronization of the displacement and alignment with the flash frequency of the pulsed YAG laser. A rapid calculation makes it possible to estimate the necessary displacement speed. Assuming the use of a 1 W laser permitting the formation of 1000 elementary beams of 1 mW, 2.4 nJ per hole would be needed and consequently each hole would have to be irradiated for 2.4×$10^{-6}$ seconds. The total irradiation time for 1 m is consequently approximately 25 seconds (because there are $10^{10}$ holes), which is completely reasonable. However, the major problem still remains of the displacement between the holes.

If it is borne in mind that it is necessary to remain half the time on the photosensitive resin between the holes to prevent the irradiation thereof and that the interval is approximately 4 $\mu$m, it is necessary to displace the elementary beams or plates carrying the photosensitive resin at a speed of approximately 4 m/s and on each occasion it must be displaced by a few micrometers. Unfortunately, in the state of the art, the best piezoelectric displacements which would make it possible to displace the plate by a few micrometers do not make it possible to obtain speeds exceeding a few cm/s. Thus, this constitutes the limitation in that it is difficult or even impossible to displace a 1 m² plate or a 10 cm strip by a few µm with a total travel close to 1 m and at a speed of 4 m/s without stopping.

The present invention avoids having to solve this problem. For this purpose, the invention uses recording by continuous irradiation. The same type of system as hereinbefore is used with an image multiplier (×1000) and a continuous YAG laser. The method used consists of merely continuously moving the 1000 elementary beams at a continuous speed over the entire plate to be treated, so as to obtain a succession of parallel lines on the photosensitive resin.

The major difference compared with what has been stated hereinbefore is that there is no longer a stoppage at each hole and there is consequently no longer any need for a piezoelectric displacement. Each line is irradiated with half the dose necessary for development. The plate is then turned by 90° and the same line pattern is reproduced. The figure obtained is a grid, whose intersections have received a light dose permitting the development of the holes at these intersections.

For example, choice is made of a laser which is half as powerful as hereinbefore (½ W) in order to irradiate the lines at half the dose necessary for development and the plate is moved at the same speed of 4 m/s, which is completely conceivable in that there is a continuous displacement of the plate. The total treatment time is approximately 1 minute or a few minutes, if account is taken of vertical displacements and overpasses at the end of the plate. It is possible to choose a less powerful laser or a strip having more than 1000 optical fibres. The travel speed of the plate in front of the optical fibres is slower in the latter case and a less rapid motorization system is then chosen.

Special reference is made to the binary character of the process used in the invention, namely at each intersection a hole is obtained and there are no holes elsewhere. Thus, the aim is not to modulate the power of the laser in order to obtain sloping resin patterns, as in the case of documents (1) "Preshaping photoresist for refractive microlens fabrication", T. R Jay et al., SPIE vol. 1992, Miniature and Micro-Optics and Micromechanics, 1993, pp 275 to 282; (2) "One-step 3D shaping using a gray-tone mask for optical and microelectronic applications", Y. Oppliger et al., Microelectronic Engineering 23, 1994, pp 449 to 454; (3)"Fabrication of relief-topographic surfaces with a onestep UV-lithographic process", H. J. Quenzer et al., pp 163 to 172; (4) "Continuous-relief microptical elements fabricated by laser beam writing", G.

Przyrembel, pp 219 to 228; (5) "Generation of relief-type surface topographies for integrated microoptical elements", J. Wengelink et al., pp 209 to 217; (6) "Laser beam lithographed micro-Fresnel lenses", M. Haruna et al., Applied Optics, vol. 29, No. 34, Dec. 1, 1990, pp 5120 to 5126; and (7) "Lighographie tridimensionnelle par exposition à niveaux de gris", Japon Optoélectronique, No. 17, December 1993, January-Febuary 1994, p 16.

SUMMARY OF THE INVENTION

Therefore the present invention relates to a process for the formation of patterns in a photoresist, said process being characterized in that it comprises the following stages:

elementary light beams are formed, whose axes are parallel, at least one first relative translation takes place at a constant speed and constant light power of said elementary beams with respect to the photoresist, the elementary beams being focused thereon, so as to irradiate first parallel lines of said photoresist, said speed and said power being chosen in such a way that each first irradiated line receives a first light dose lower than the light dose necessary for the development of said photosensitive resin, there is a relative rotation by a given angle of all the elementary light beams with respect to the photoresist, there is at least one second relative translation, at constant speed and constant light power, of said elementary beams with respect to the photoresist, the elementary beams being focused on the latter, so as to irradiate second parallel lines of said photoresist, said speed and said light power being chosen in such a way that each second irradiated line receives a second light dose equal to the difference between the light dose necessary for the development and the first dose, so that only the intersections of the first and second lines receive the dose necessary for the development and the photosensitive resin is developed, patterns consequently being formed at said intersections.

According to a preferred embodiment of the process according co the invention, the first and second relative translations are performed at the same speed and same light power, said speed and said light power being chosen in such a way that the first and second light doses are both equal to half the dose necessary for the development.

Preferably, the relative rotation angle is 90°.

According to a first special embodiment of the process according to the invention, the photoresist remains fixed and all the elementary light beams are displaced relative to said photoresist during the first and second translations.

According to a second special embodiment, all the elementary light beams remain fixed and the photoresist is displaced relative thereto during first and second translations.

According to a third special embodiment, all the elementary light beams and the photoresist are displaced in opposite directions during the first and second translations. This makes it possible to use a motorization which is half as fast as in the two preceding embodiments.

According to another embodiment of the invention, there is at least one series of several first successive translations and also at least one series of several second successive translations and, between two first successive translations and between two second successive translations, there is a relative translation of all the elementary light beams with respect to the photoresist, perpendicular to the corresponding lines and with a spacing such that the distance between two adjacent light beams is a multiple of this spacing.

In this case, according to a special variant, there is a plurality of series of first and second translations and, between two successive series, there is a relative translation of all the elementary light beams with respect to the photoresist, perpendicular to the corresponding lines and with a spacing equal to the sum of the distance between the axes of the elementary light beams furthest from one another and the distance between the two corresponding, adjacent lines.

It is possible to use a positive photosensitive resin, the patterns formed then being holes.

However, it is also possible to use a negative photosensitive resin, in which case the patterns formed are blocks or studs. In the latter case, the invention is applicable to the production of binary diffractive optics.

The present invention also relates to an apparatus for the formation of patterns in a photoresist, for performing the process according to the invention, said apparatus being characterized in that it comprises:

a light source able to transmit a light beam having a constant power, means for forming said focused, elementary light beams from the constant power light beam and means for the relative translation and rotation of the means for forming said elementary light beams with respect to the photo resist, said relative translation and rotation means being provided to carry out said first and second relative translations and said relative rotation.

According to a special embodiment of the apparatus according to the invention, the means for forming said focused, elementary light beams comprises:

an array of optical fibres, said optical fibres having first ends, whose axes are parallel to one another, and second ends, which are optically coupled to the light source, so as to form elementary light beams respectively in the optical fibres and an array of optical focusing means optically coupled respectively to the first ends of the optical fibres and able to focus the elementary light beams onto the photoresist.

The present invention also relates to a process for the production of a microtip emissive cathode electron source, in which:

a structure is formed having cathode conductors on a substrate, an electrically insulating layer and grids forming an angle with the cathode conductors, in the areas where the grids cross the cathode conductors, holes are formed through the grids and the insulating layer and electron emitting material microtips are formed in these holes on the cathode conductors, said process being characterized in that said holes are obtained by forming a positive photoresist at least in said areas, at the surface of the structure, forming holes in the photoresist in accordance with the pattern formation process according to the invention, and etching the grids and insulating layer through said holes formed in the photoresist.

The invention also relates to a flat screen using the thus produced source.

BRIEF DESCRIPTION OF THE DRAWINGS

The present invention is described in greater detail hereinafter relative to non-limitative embodiments and with reference to the attached drawings, wherein.

DETAILED DESCRIPTION OF EMBODIMENTS

Figure 1:
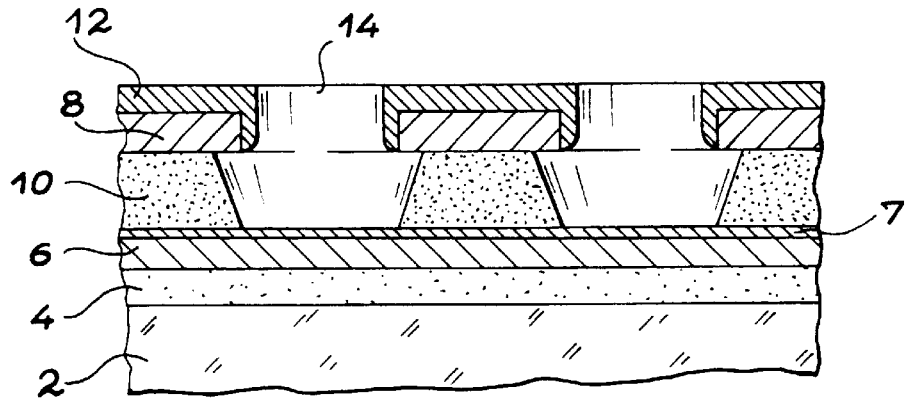
FIGS. 1 to 3, already described, diagrammatically and partially illustrate a known process for the production of a microtip emissive cathode electron source.
Figure 2:
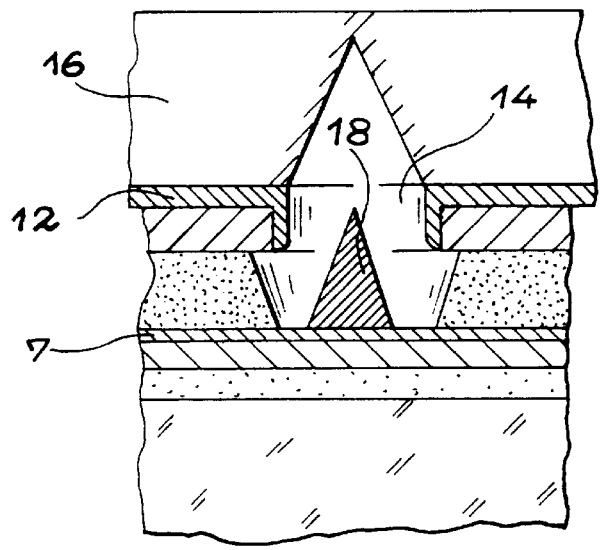
Figure 3:
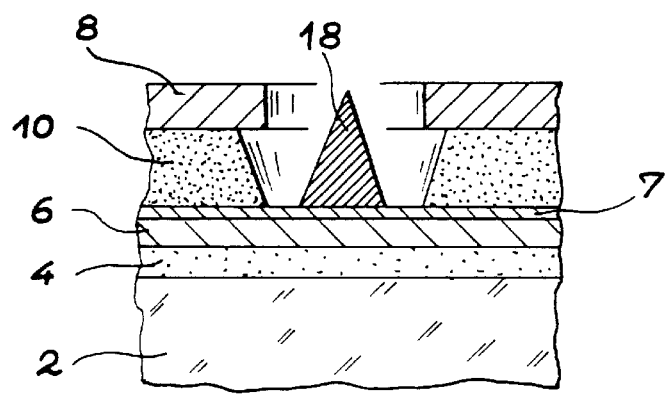
Figure 4:
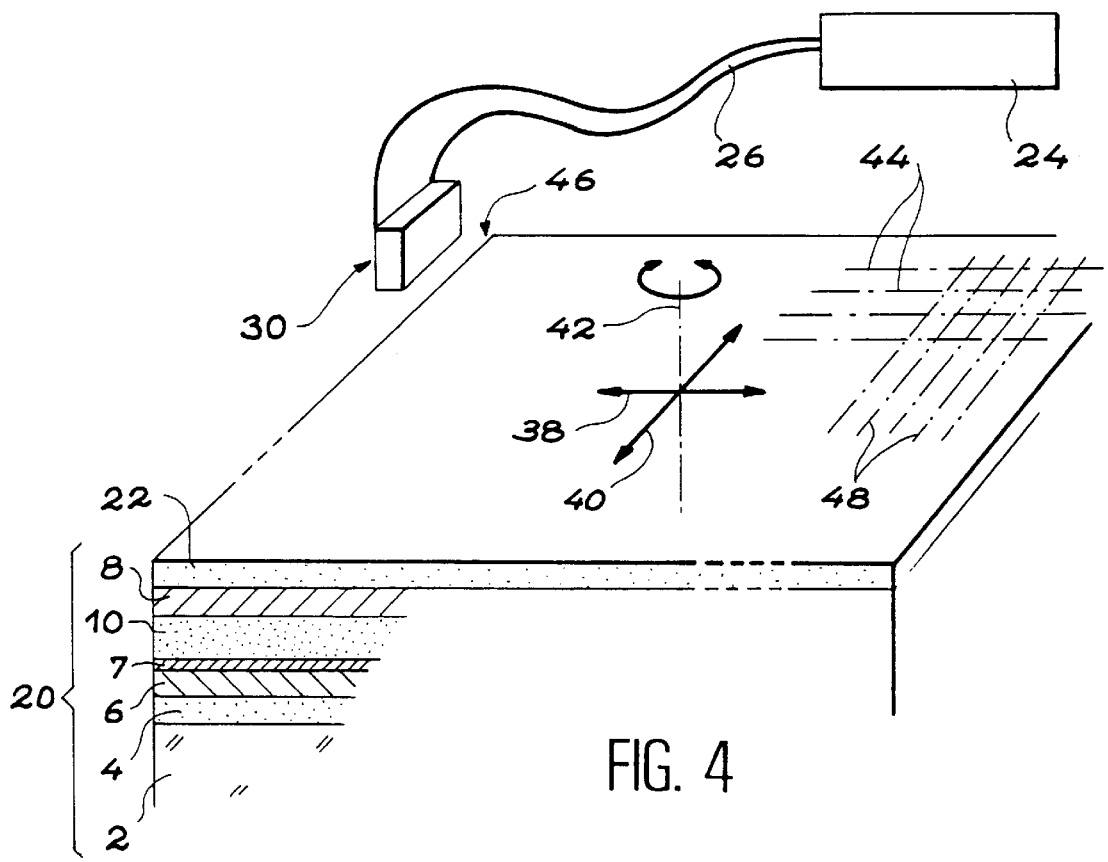
FIG. 4 diagrammatically and partially illustrates an apparatus permitting the performance of a process according to the invention.

FIG. 4 diagrammatically and partially shows the structure referred to in the description of FIGS. 1 to 3 and which comprises the substrate 2, insulator 4, cathode conductors 6, resistive layer 7, grids 8 and intermediate insulator 10. The aim is to make holes in the grids 8 and the intermediate insulator 10 by means of a process according to the inventions. In order to make these holes, on the surface of the structure 20 in FIG. 4, is deposited a positive photosensitive resin layer or photoresist 22.

Figure 5:
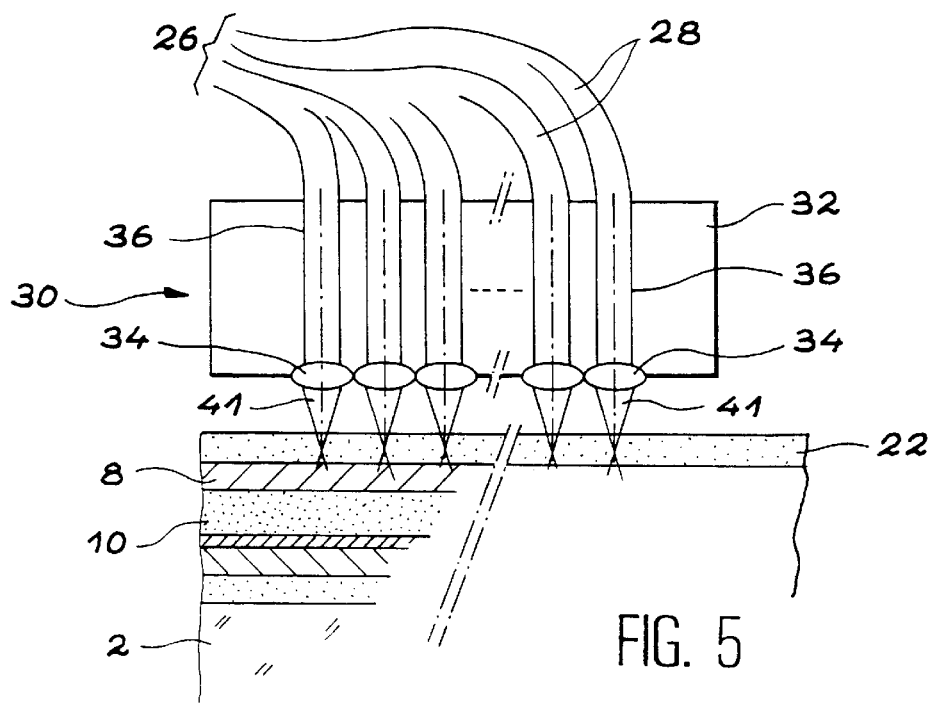
FIG. 5 is a diagrammatic view of part of said apparatus.

The apparatus diagrammatically shown in FIG. 4 and whereof part is shown in greater detail in FIG. 5, makes it possible to perform a process according to the present invention. This apparatus comprises a YAG laser 24 supplying a light beam, a bundle 26 of optical fibres 28 and means 30 for focusing the light beams. These focusing means 30 incorporate a linear array or strip 32 equipped with microlenses 34 respectively associated with the optical fibres 28. One end of each optical fibre 28 is optically coupled to the laser 24 (not shown). Thus, the light beam emitted by said laser is subdivided into the same number of elementary beams as there are optical fibres, each fibre being traversed by elementary light beams.

The other end 36 of each optical fibre 28 is rendered rigidly integral with the strip 32 and is optically coupled to the microlens 34 associated therewith, as can be seen in FIG. 5. The optical axes of the ends 36 of the optical fibres 28 respectively coincide with the optical axes of the microlenses 34. The latter have the function of focusing the elementary light beams transported by the optical fibres 28 onto the photoresist 22. In a purely informative and non-limitative manner, the strip 32 has one thousand optical fibres 28 optically coupled to one thousand microlenses 34 with a diameter of 10 $\mu$m.

The apparatus of FIGS. 4 and 5 also comprises means for the tanslatory displacement of the strip 32 in two directions perpendicular to one another above the photoresist 22. These translatory displacement means are symbolically represented in FIG. 4 by arrows 38 and 40, which are perpendicular to one another. The strip 32 and consequently the elementary, focused light beams 41 from the microlenses 34 are consequently able to move above the entire photoresist 22.

In another, not shown embodiment, the strip 32 remains fixed and it is the photoresist 22 which is displaceable with respect to said strip, in two directions perpendicular to one another. More specifically in this case, the structure 20 provided with the photoresist 22 is placed on a support (not shown) which is equipped with translators displacement means in said two directions perpendicular to one another with respect to the fixed strip 32.

In another, not shown embodiment, the strip 32 and the support are both displaceable in said two directions perpendicular to one another, in reverse senses, which makes it possible in the manner described hereinbefore to use a motorization which is half as fast.

The apparatus of FIGS. 4 and 5 also comprises means for rotating the strip 32 and consequently the elementary light beams focused by the microlenses 34 around an axis 42, which is perpendicular to the photoresist 22 and therefore to the directions 38 and 40 (which are parallel to the photoresist 22). In the example shown, the rotation angle is 90°.

In another embodiment, it is the support (not shown) of the structure 20 and the photoresist 22 which is provided with means permitting its rotation by 90° about said axis 42, the strip 32 then not being displaceable in rotation.

Figure 6:
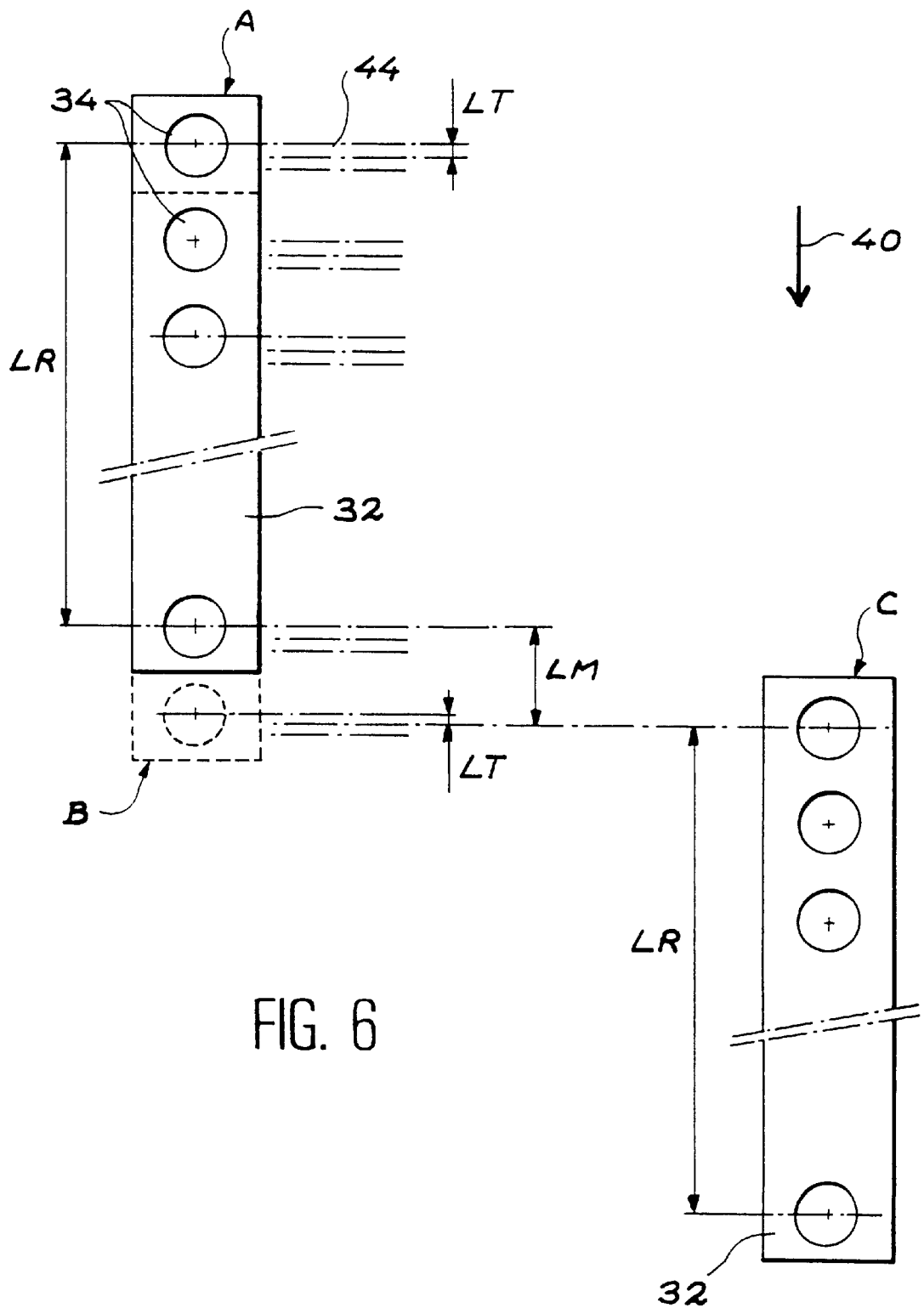
FIG. 6 represents diagrammatically the process according to the invention.

On returning to the apparatus described relative to FIGS. 4 and 5, FIG. 6 shows a larger scale representation of the strip 32 in plan view. The microlenses 34 are not all shown in FIG. 6 and with a view to simplification the scales are not always respected. As will be shown in greater detail hereinafter, the apparatus of FIGS. 4, 5 and 6 makes it possible to irradiate the photoresist 22 along straight, parallel lines 44. FIG. 6 is only of interest for facilitating understanding of the displacement of strip 32 in direction 40. The displacement of strip 32 in direction 38 is not shown in FIG. 6.

An explanation will be given hereinafter as to how to form the holes 14 in the grids and intermediate insulator referred to in the description of FIGS. 1 to 3, using a process according to the present invention. More specifically, the aim is to form a microtip emissive cathode source and to this end the initial stage is to form on the substrate 2 an insulator 4, cathode conductors 6, resistive layer 7, intermediate insulator 10 and grids 8 referred to hereinbefore. In this case, where it proves necessary, this is followed by a masking in one or more stages of the areas where it is not wished to produce holes. For this purpose, reference can e.g. be made to document U.S. Pat. No. 4,857,161 (corresponding to document (1)). Then, according to the present invention, the photoresist 22 is spread over the surface of the structure 20 obtained. The thickness of the photoresist 22 is e.g. 1 μm. The photoresist is then hardened by heating in the oven. The photosensitive resin is then irradiated in the manner described hereinafter.

The strip 32 is displaced parallel to the plane of the photoresist 22, e.g. starting from the upper, left-hand corner 46 in FIG. 4 of said photoresist 22 and laterally sweeping the photoresist 22 in direction 38, over the entire width of said photoresist 22. This operation makes it possible to irradiate a first series of lines 44 visible in FIGS. 4 and 6. The speed of movement of the strip 32 (or, in another embodiment, the speed of movement of the support of the structure 20 provided with the photoresist 22, if the strip remains fixed) is chosen so as to irradiate the photosensitive resin at half the dose necessary for the development thereof. The strip 32 is then moved towards the front of the photoresist 22 in direction 40 by a distance equal to the spacing LT of the network of lines 44 which it is wished to irradiate, said spacing being e.g. 4 μm.

The preceding operation is recommenced for irradiating a second series of lines, which are parallel to the already formed lines. This displacement is also indicated in FIG. 6. Initially, the strip 32 is in position A in FIG. 6. The two operations in question are repeated for the number of times necessary in order to obtain a system of lines all spaced by the same spacing LT, which is 4, um in the considered example and without any repeat on the same line. This operation is repeated 24 times for lens diameters of 100 μm.

This succession of parallel, straight line patterns makes it possible to produce a system, whose width LR in direction 40 is equal to the distance between the first and last microlenses of the strip 32, plus the distance LM between two successive microlens centers, less the spacing LT between two lines, i.e. in the considered example: 10 cm+100 μm-4 μm. At the end of this first stage, the strip 32 is in position B in FIG. 6.

The following stage of the process consists of displacing the strip 32 in direction 40 by a distance of LR+LT. The strip 32 is then in position C in FIG. 6. The two preceding operations are then repeated. In this way the entire surface of the photoresist 22 is covered with a system of parallel lines, all spaced by 4 μm in the considered example. It should be noted that it is necessary for the distance between two adjacent microlens centers to be an integral multiple of the spacing between the lines. In the opposite case, the system of lines would not be completely regular.

The following stage of the process consists of rotating the structure 20, provided with the photoresist 22 by 90° and recommencing all the preceding operations in order to create a second system of straight lines 48 (cf. FIG. 4), which are perpendicular to the lines 44 of the first system, once again irradiating the photoresist 22 at half the dose necessary for the development of the photosensitive resin.

These two systems form a grating, whose intersections have received a light dose permitting the development of the photoresist 22. After development, an array of holes is obtained in the photoresist, each hole being formed at one of the intersections. The diameter of these holes is clearly a function of the width of the line. This width is in itself a function of the optical characteristics of the microlenses 34. The diameter and shape of the holes are also dependent on the contrast of the photosensitive resin used.

Following the development of the photoresist and the obtaining of the holes therein, the thus microperforated photoresist serves as a mask for the formation of holes in the underlying layers 8 and 10 of the structure 20, in order to obtain a structure according to FIG. 1. More specifically, etching takes place through the holes formed in the photoresist, the grids 8 and the intermediate insulator 10 in order to form the holes 14 therein (FIG. 1). The photoresist 22 is then removed. The nickel layer 12 is then deposited on the structure obtained under glancing incidence. This is followed by the deposition of the molybdenum layer 16, leading to the formation of the microtips 18, followed by the removal of the nickel layer 12 and the molybdenum layer 16.

In another embodiment of the process according to the invention, a negative photosensitive resin layer is placed on an appropriate substrate. The irradiation of said negative photoresist in accordance with the networks of lines perpendicular to one another in the manner described hereinbefore, followed by the development of the thus irradiated negative photoresist lead to an array of negative photosensitive resin studs on the substrate, which are located at the intersections of the networks of lines.

We claim:

1. A process for the formation of patterns in a photoresist layer comprising:

forming a plurality of non-mutually interfering elementary light beams at a surface of the photoresist layer;

performing at least one first relative translation at a constant speed and constant light power of said elementary beams with respect to the photoresist layer, the elementary beams being focused on the photoresist, so as to irradiate first parallel lines of said photoresist layer, said speed and said power being chosen in such a way that each first irradiated parallel line receives a first light dose lower than the light dose necessary for the development of said photoresist layer;

performing a relative rotation by a given angle of all the elementary light beams with respect to the photoresist layer;

performing at least one second relative translation, at constant speed and constant light power, of said elementary beams with respect to the photoresist layer, the elementary beams being focused on the photoresist layer, so as to irradiate second parallel lines of said photoresist layer which intersect said first parallel lines, said speed and said light power being chosen in such a way that each irradiated second parallel line receives a second light dose equal to the difference between the light dose necessary for the development and the first light dose, so that only the intersections of the first and second lines receive the dose necessary for the development; and developing the photoresist such that patterns are formed at said intersections.

2. The process according to claim 1, further comprising: performing the first and second relative translations at the same speed and same light power, said speed and said light power being chosen in such a way that the first and second light doses are both equal to half the dose necessary for the development.

3. The process according to claim 1, further comprising: performing the relative rotation at an angle of 90°.

4. The process according to claim 1, further comprising: performing first and second relative translations by keeping the photo-resist layer in a fixed position while the elementary light beams are displaced with respect to said photoresist layer.

5. The process according to claim 1, further comprising: performing first and second relative translations by keeping the elementary light beams in a fixed position while the photoresist layer is displaced relative to the elementary light beams.

6. The process according to claim 1, further comprising: performing first and second relative translations by displacing the elementary light beams and the photoresist layer in opposite directions.

7. The process according to claim 1, further comprising: performing at least one series of several successive first relative translations and also at least one series of several successive second relative translations; and performing, between any two successive first relative translations and between any two successive second relative translations, a first relative movement of all the elementary light beams with respect to the photoresist layer, said first relative movement being perpendicular to the irradiated lines of the previous successive relative translation and with a spacing (LT) such that the distance (LM) between two adjacent light beams is a multiple of this spacing.

8. The process according to claim 7, further comprising: performing a plurality of series of relative first and relative second translations; and performing, between any two successive series, a second relative movement of all the elementary light beams with respect to the photoresist layer, said second relative movement being perpendicular to the irradiated lines of the previous series of relative translations and with a spacing equal to the sum of the distance (LR) between the axes of the elementary light beams furthest from one another and the distance (LT) between the two corresponding, adjacent lines.

9. The process according to claim 1, further comprising: forming the patterns in the photoresist layer using positive photoresist, so that the patterns formed are holes.

10. The process according to claim 1, further comprising: forming the patterns in the photoresist layer using negative photoresist, so that the patterns formed are studs.

11. An apparatus for the formation of patterns in a photoresist layer comprising:

a light source able to transmit a light beam having a constant power;

means for the formation of a plurality of non-mutually interfering, elementary light beams at a surface of the photoresist layer from the constant power light beam; and means for the relative translation and rotation of the means for the formation of a plurality of said non mutually interfering elementary light beams with respect to the photoresist layer.

12. The apparatus according to claim 11, characterized in that the means for formation of said plurality of elementary light beams comprises:

an array of optical fibers having first ends, whose axes are parallel to one another, and second ends which are optically coupled to the light source, so as to form elementary light beams respectively in the optical fibers; and an array of optical focusing means optically coupled respectively to the first ends of the optical fibers and able to focus the elementary light beams onto the photoresist layer.

13. A process for the production of a microtip emissive cathode electron source, comprising:

forming a structure having a plurality of parallel cathode conductors on a substrate, an electrically insulating layer covering said cathode conductors; and a plurality of parallel grids over said insulating layer and positioned at an angle with said cathode conductors;

forming holes through the grids and insulating layer in areas where the grids cross the cathode conductors, said process of forming holes comprising, depositing a layer of positive photoresist at least in said areas where the grid crosses the cathode conductor, forming a plurality of non-mutually interfering elementary light beams at a surface of the photoresist layer, performing at least one first relative translation at a constant speed and constant light power of said elementary beams with respect to the photoresist layer, the elementary beams being focused on the photoresist, so as to irradiate first parallel lines of said photoresist layer, said speed and said power being chosen in such a way that each first irradiated parallel line receives a first light dose lower than the light dose necessary for the development of said photoresist layer, performing a relative rotation by a given angle of all the elementary light beams with respect to the photoresist layer, performing at least one second relative translation, at constant speed and constant light power, of said elementary beams with respect to the photoresist layer, the elementary beams being focused on the photoresist layer, so as to irradiate second parallel lines of said photoresist layer which intersect said first parallel lines, said speed and said light power being chosen in such a way that each irradiated second parallel line receives a second light dose equal to the difference between the light dose necessary for the development and the first light dose, so that only the intersections of the first and second lines receive the dose necessary for the development, developing the photoresist such that patterns are formed at said intersections, etching the grids and insulating layer through said holes formed in the photoresist; and forming electron emitting material microtips in said holes on the cathode conductors.

14. The process according to claim 13, wherein said process is used to form an electron source for a flat screen display.

* * * * *